(12) United States Patent
Buvid et al.

(10) Patent No.: US 10,613,283 B2
(45) Date of Patent: Apr. 7, 2020

(54) COAXIAL WIRE AND OPTICAL FIBER TRACE VIA HYBRID STRUCTURES AND METHODS TO MANUFACTURE

(71) Applicant: INTERNATIONAL BUSINESS MACHINES CORPORATION, Armonk, NY (US)

(72) Inventors: Daniel J. Buvid, Rochester, MN (US); Eric J. Campbell, Rochester, MN (US); Sarah K. Czaplewski, Rochester, MN (US); Christopher W. Steffen, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/052,184

(22) Filed: Aug. 1, 2018

(65) Prior Publication Data
US 2018/0372975 A1   Dec. 27, 2018

Related U.S. Application Data

(62) Division of application No. 15/347,368, filed on Nov. 9, 2016, now Pat. No. 10,088,642.

(51) Int. Cl.
*G02B 6/44* (2006.01)
*H01L 23/498* (2006.01)
(Continued)

(52) U.S. Cl.
CPC ............ *G02B 6/4416* (2013.01); *B33Y 10/00* (2014.12); *B33Y 80/00* (2014.12);
(Continued)

(58) Field of Classification Search
CPC .............................. G02B 6/4416; H01B 11/22
See application file for complete search history.

(56) References Cited

U.S. PATENT DOCUMENTS

| | | |
|---|---|---|
| 5,220,135 A | 6/1993 | Kawakami et al. |
| 7,186,924 B2 | 3/2007 | Geva et al. |

(Continued)

FOREIGN PATENT DOCUMENTS

| | | |
|---|---|---|
| JP | 2-278720 A | 11/1990 |
| JP | 6-61150 A | 3/1994 |
| JP | 11-163192 A | 6/1999 |

OTHER PUBLICATIONS

List of IBM Patents or Patent Applications Treated as Related dated Aug. 1, 2018, 2 pages.

*Primary Examiner* — Sung H Pak
(74) *Attorney, Agent, or Firm* — Tutunjian & Bitetto, P.C.; Nathan Rau

(57) ABSTRACT

A method of forming a coaxial wire that includes providing a sacrificial trace structure using an additive forming method, the sacrificial trace structure having a geometry for the coaxial wire, and forming a continuous seed metal layer on the sacrificial trace structure.

The sacrificial trace structure may be removed and a first interconnect metal layer may be formed on the continuous seed layer. An electrically insulative layer may then be formed on the first interconnect metal layer, and a second interconnect metal layer is formed on the electrically insulative layer. Thereafter, a dielectric material is formed on the second interconnect metal layer to encapsulate a majority of an assembly of the first interconnect metal layer, electrically insulative layer and second interconnect metal layer that provides said coaxial wire. Ends of the coaxial wire may be (Continued)

exposed through opposing surfaces of the dielectric material to provide that the coaxial wire extends through that dielectric material.

19 Claims, 7 Drawing Sheets

(51) Int. Cl.
| | |
|---|---|
| *H01L 21/48* | (2006.01) |
| *H01L 21/56* | (2006.01) |
| *G02B 6/02* | (2006.01) |
| *H01B 13/016* | (2006.01) |
| *H05K 3/00* | (2006.01) |
| *B33Y 80/00* | (2015.01) |
| *B33Y 10/00* | (2015.01) |
| *G02B 6/42* | (2006.01) |
| *G02B 6/43* | (2006.01) |

(52) U.S. Cl.
CPC ....... *G02B 6/02033* (2013.01); *H01B 13/016* (2013.01); *H01L 21/486* (2013.01); *H01L 21/56* (2013.01); *H01L 23/49827* (2013.01); *H01L 23/49894* (2013.01); *H05K 3/0014* (2013.01); *G02B 6/4274* (2013.01); *G02B 6/43* (2013.01); *H01L 23/49816* (2013.01); *H01L 2224/16225* (2013.01); *H01L 2924/15311* (2013.01); *Y10T 29/49123* (2015.01)

(56) References Cited

U.S. PATENT DOCUMENTS

| | | | |
|---|---|---|---|
| 7,791,898 | B2 | 9/2010 | Peytavy et al. |
| 8,134,084 | B2 | 3/2012 | Kawaguchi et al. |
| 8,362,365 | B2 | 1/2013 | Ho et al. |
| 9,006,581 | B2 | 4/2015 | Kawaguchi et al. |
| 9,070,674 | B2 | 6/2015 | Gallegos et al. |
| 9,226,435 | B2 | 12/2015 | Fisher, Jr. et al. |
| 2015/0357699 | A1 | 12/2015 | Yamaguchi et al. |
| 2016/0178663 | A1 | 6/2016 | Prabhugoud et al. |
| 2016/0314876 | A1* | 10/2016 | Charbonneau-Lefort .................. H01B 3/02 |
| 2017/0209898 | A1 | 7/2017 | Henneken et al. |
| 2017/0365379 | A1* | 12/2017 | Broughton ............ H01B 11/22 |

* cited by examiner

US 10,613,283 B2

COAXIAL WIRE AND OPTICAL FIBER TRACE VIA HYBRID STRUCTURES AND METHODS TO MANUFACTURE

BACKGROUND

Technical Field

The present invention generally relates to interconnect structures, and more particularly to forming coaxial wire structures through dielectric structures.

Description of the Related Art

Copper wires and interconnects typically seen in printed circuit board (PCBs), interposers and package substrates. An interposer is a form of interconnect that is placed between a printed circuit board (PCB) and a processor. As chips continue to scale, chips become denser requiring a higher pin count for the input/output (I/O). An interposer is used to spread a connection to a wider pitch or to re-route to a different connection. Some conventional interconnect structure employ coaxial wires. In conventional interconnect structures that extend through a substrate, coaxial wires are limited to being straight.

SUMMARY

In one embodiment, a method of forming a coaxial wire is described herein that includes providing a sacrificial trace structure using an additive forming method, the sacrificial trace structure having a geometry for the coaxial wire, and forming a continuous seed metal layer on the sacrificial trace structure. The sacrificial trace structure may be removed and a first interconnect metal layer may be formed on the continuous seed layer. An electrically insulating layer may then be formed on the first interconnect metal layer, and a second interconnect metal layer is formed on the electrically insulating layer. Thereafter, a dielectric material is formed on the second interconnect metal layer to encapsulate a majority of an assembly of the first interconnect metal layer, electrically insulating layer and second interconnect metal layer that provides said coaxial wire. Ends of the coaxial wire may be exposed through opposing surfaces of the dielectric material to provide that the coaxial wire extends through that dielectric material.

In another embodiment, the method of forming the coaxial wire includes providing a sacrificial trace structure using an additive forming method, the sacrificial trace structure having a geometry for the coaxial wire having at least one non-linear portion, and forming a continuous seed metal layer on the sacrificial trace structure. The sacrificial trace structure may be removed, wherein the continuous seed metal layer remains. A first interconnect metal layer is formed on the continuous seed layer having the at least one non-linear portion. An electrically insulating layer is then formed on the first interconnect metal layer, and a second interconnect metal layer is formed on the electrically insulating layer having said at least one non-linear portion. A dielectric material is formed on the second interconnect metal layer to encapsulate a majority of an assembly of the first interconnect metal layer, electrically insulating layer and second interconnect metal layer that provides said coaxial wire having the at least one non-linear portion. The ends of the coaxial wire are exposed through opposing surfaces of the dielectric material to provide a coaxial wire extending through the dielectric material.

In another aspect of the present disclosure, a coaxial wire structure is provided that includes a dielectric base material, and a metal based interconnect structure extending through said dielectric base material from a first side of the dielectric base material to an opposing second side of the dielectric base material. At least one metal line of the metal based interconnect structure has a curvature extending from the first side of the dielectric base material to said second side of said dielectric base material, the metal based interconnect structure being an assembly of a first metal interconnect layer and a second metal interconnect layer separated from each other by an electrically insulating layer.

In another aspect of the present disclosure, a method of forming an optical fiber is described. In one embodiment, the method includes forming an optical fiber from a polymeric material using an additive forming method, wherein a geometry for the optical fiber comprises at least one non-linear portion. A cladding layer is formed on the optical fiber. A dielectric material may then be formed on the cladding layer to encapsulate a majority of an assembly of the cladding layer and the optical fiber. The ends of the assembly are exposed through opposing surfaces of the dielectric material to provide an optical fiber extending through the dielectric material.

In another aspect, a structure including an optical fiber is described that includes a dielectric base material, and a polymeric optical fiber extending through said dielectric base material from a first side of the dielectric base material to an opposing second side of the dielectric base material. The at least one polymeric optical fiber has at least one non-linear portion. In some embodiments, the polymeric optical fiber and the dielectric base material separated from each other by at least one metal cladding layer.

These and other features will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1A:
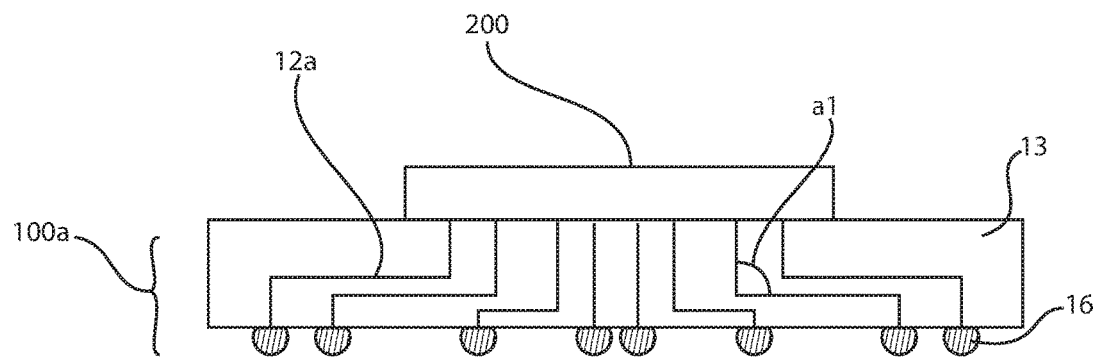
FIG. 1A is a side cross-sectional view depicting one embodiment of a structure including a coaxial wire that includes non-linear portions provided by linear metal wires intersecting at angles.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide coaxial wire structures, and structures including fiber optics, and more particularly provide for forming structures for transmitting signals that have curvatures and angled portions through dielectric structures. Copper wires, coaxial wires, interconnects and optical fibers typically seen in electrical devices, e.g., devices including printed circuit boards, interposers and package substrates, are typically limited to being manufactured in straight horizontal and vertical directions. In some embodiments, the methods and structures disclosed herein manufacture coaxial wires and optical fiber including structures, in which the coaxial wire and the optical fiber include orthogonal and curved pathways. This can allow for shorter interconnect, lower latency and lower impedance in the electrical devices employing the structures and methods described herein. The following disclosed coaxial wiring structure is based off trace via hybrid structures and manufacturing methods. The disclosed structures and manufacturing methods provide a greater packing density and/or signal integrity than traditional via and trace structure and would be cheaper to manufacture than coaxial structures in silicon interposer, which rely on expensive photolithography techniques.

Figure 1B:
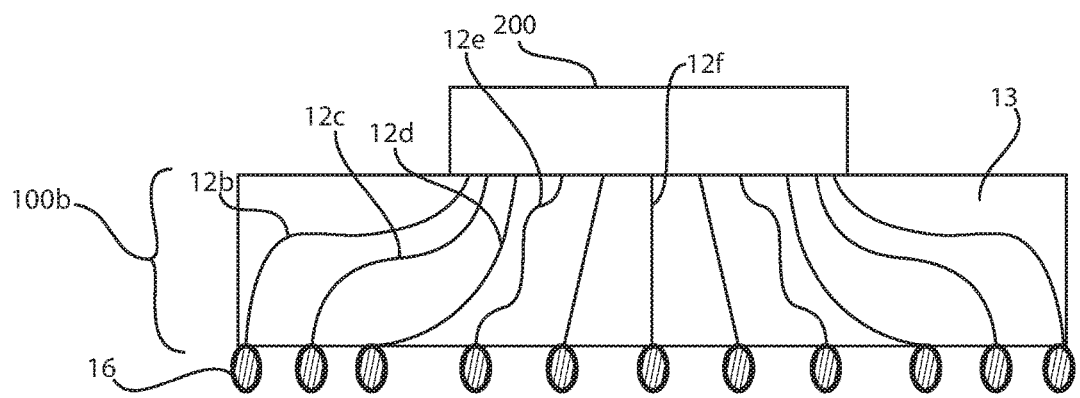
FIG. 1B is a side cross-sectional view depicting one embodiment of a structure including a coaxial wire that includes non-linear portions provided by portions having at least one curvature.
Figure 1C:
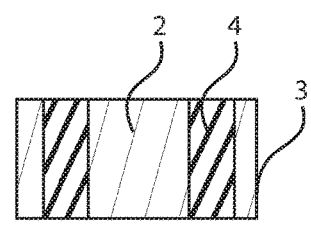
FIG. 1C is a magnified side cross-sectional view of a portion of a coaxial wire that may be incorporated into the structures depicted in FIGS. 1A and 1B.

FIGS. 1A-1B illustrate some embodiments, of an interposer 100a, 100b including one example of an interconnect structure within the scope of the present disclosure, that includes a coaxial wire structure 12a, 12b, 12c, 12d, 12e. FIG. 1A depicts one embodiment of a structure including a coaxial wire 12a that includes non-linear portions provided by linear metal wires intersecting at an angle α. FIG. 1B depicts one embodiment of a structure including a coaxial wire 12b, 12c, 12d, 12e that includes non-linear portions provided by portions having at least one curvature. As illustrated in FIG. 1C, the coaxial wire structures 12a, 12b, 12c, 12d, 12e each include two metal wires 2, 3 separated by an electrically insulating material layer 4.

In some embodiments, the interposer 100a, 100b includes a dielectric base material, i.e., dielectric body 13, and a coaxial wire structure 12a, 12b, 12c, 12d, 12e extending through said dielectric base material from a first side of the dielectric base material to an opposing second side of the dielectric base material. At least one metal line of the coaxial wire structure 12a, 12b, 12c, 12d, 12e extends from the first side of the dielectric base material 13 to the second side of the dielectric base material 13 and includes a non-linear portion. Still referring to FIGS. 1A and 1B, in some embodiments, solder connections 16, e.g., solder bumps, may be present on opposing sides of the dielectric body 13 on exposed surfaces of the coaxial wire structure 12a, 12b, 12c, 12d, 12e. Although depicted as a single solder bump, for a coaxial wire structure 12a, 12b, 12c, 12d, 12e there may be separate electrical connection to each metal wire 2, 3 in the coaxial wire structure 12a, 12b, 12c, 12d, 12e.

In some embodiments, the coaxial wire structure 12a, 12b, 12c, 12d, 12e extends through the dielectric body 13 an provide for electric communication across the interposer 100a, 100b from a first side of the interposer 100a, 100b that may be in electric contact with a microprocessor 200 to a second side of the interposer 100a, 100b. The second side of the interposer 100a, 100b may be in contact with a supporting substrate (not shown), in which the supporting substrate may include its own interconnect structure that is to be positioned in electrical communication with the metal based interconnect structure 12a, 12b, 12c, 12d, 12e of the interposer 100a, 100b.

Referring to FIGS. 1A, 1B and 1C, the coaxial wire structures 12a, 12b, 12c, 12d, 12e may be composed of metal wires 2, 3 composed of any electrically conductive metal. "Electrically conductive" as used through the present disclosure means a material typically having a room temperature conductivity of greater than $10^5$ (S/m). In some embodiments, the metal wires 2, 3 of the coaxial wire structure 12a, 12b, 12c, 12d, 12e may be comprised of aluminum (Al), copper (Cu), tungsten (W), tantalum (Ta), platinum (Pt), gold (Au), silver (Ag), and other elemental metals. In other embodiment, the metal wires 2, 3 of the coaxial wire structure 12a, 12b, 12c, 12d, 12e may be comprised of metal nitrides, such as tantalum nitride (TaN), titanium nitride (TiN), tungsten nitride (WN), and combinations thereof. The electrically insulating layer 4 that is separating the first metal wire 2 of the coaxial wire structure 12a, 12b, 12c, 12d, 12e from the second metal wire 3 of the coaxial wire structure 12a, 12b, 12c, 12d, 12e may be a dielectric material, such as an oxide, e.g., silicon oxide ($SiO_2$), nitride (silicon nitride) or oxynitride. In other embodiments, the electrically insulating layer 4 may be composed of a polymeric material. In some examples, the electrically insulating layer 4 is selected from the group consisting of parylene, organosiloxanes, epoxies, acrylates, urethanes, silicone, polyimide, poly(phrenylene oxide), polyamide, polyester, PEEK, polyethelyene naphthalate, polyetherimide, fluoropolymers, and combinations thereof.

The dielectric base material of the dielectric body 13a may be composed of $SiO_2$, $Si_3N_4$, $SiO_xN_y$, SiC, SiCO, SiCOH, SiCH compounds, carbon doped oxides, inorganic oxides, inorganic polymers, hybrid polymers, organic polymers, polyimides, polyphenylene oxide, organo-inorganic materials, spin-on glasses, silsesquioxane-based materials, diamond-like carbon (DLC), amorphous hydrogenated carbon and combinations thereof.

As noted above, the coaxial wire structures 12a, 12b, 12c, 12d, 12e includes non-linear portions. Referring to the interposer 100A that is depicted in FIG. 1A, the coaxial wire structure 12a may include angled portions. For example, linear line portions of the coaxial wire structure 12a may intersect at orthogonal angles α1, as depicted in FIG. 1A. Orthogonal refers to right angles, i.e., angles of 90°. It is noted that this is only one example of the angle between intersecting linear portions of the coaxial wire structure 12a. For example, in one embodiment, the angle α1 connecting intersecting line portions of the coaxial wire structure 12a may range from 15° to 85°. In other embodiments, the angle α1 connecting intersecting line portions of the coaxial wire structure 12a may range from 30° to 60°. In some examples, the angle α1 connecting intersecting liner portions of the coaxial wire structure 12a may be equal to 15°, 20°, 25°, 30°, 35°, 45°, 55°, 60°, 65°, 70°, 75°, 80°, 85° and 90°.

Referring to the interposer 100B that is depicted in FIG. 1B, the coaxial wire structures 12b, 12c, 12d, 12e may include curved portions. A curve is a line that is not straight. In some embodiments, the curvature of the metal lines 2, 3 of the coaxial wire structure is a single arc extending continuously from a first side to a second side of the dielectric base material as identified by reference number 12d. In another embodiment, the curvature of the metal lines 2, 3 for the coaxial wire structure has multiple arcs, as depicted by the structures having reference numbers 12b, 12c, and 12e. For example, the curvature may be sigmoidal. In yet other embodiments, the curvature for the metal lines 2, 3 of the coaxial wire structure may include a first arc at a first side of the dielectric body 13, and a second arc at a second side of the dielectric body 13A, wherein a linear portion of the coaxial wire structure is present therebetween, as illustrated by the structure having reference number 12b. In yet another embodiment, the coaxial wire structure may be "U" shaped, in which each end of the coaxial wire exits a single same side of the dielectric body.

It is noted that the angled structures that provide the coaxial wire structures 12a in FIG. 1A, and the curved structures that provide the coaxial wire structures 12b, 12c, 12d, 12e, may be employed simultaneously with linear coaxial wires in the same dielectric body 13. For example, FIG. 1B illustrates linear coaxial wires identified by reference number 12f.

Although the structure depicted in FIGS. 1A and 1B, is an interposer, the methods and structures disclosed herein are equally applicable to other forms of interconnect structures, as well as printed circuit boards (PCBs) and components related to printed circuit boards (PCBs). Further details of the methods of the present disclosure are now discussed with greater detail with reference to FIGS. 2-14.

Figure 2:
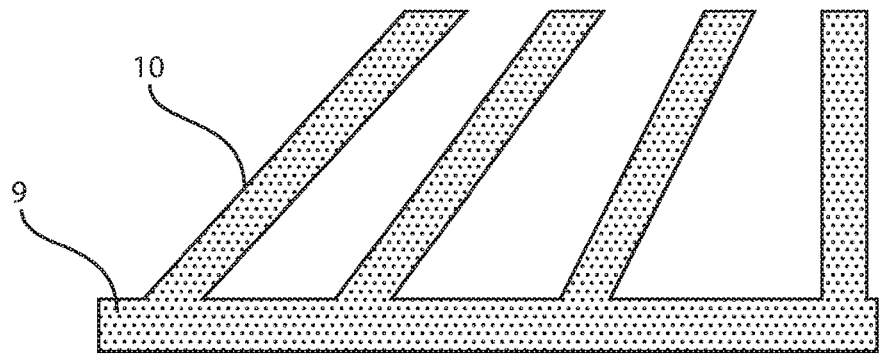
FIG. 2 is a side cross-sectional view depicting providing a sacrificial trace structure using an additive forming method, in accordance with one embodiment of the present disclosure.

FIG. 2 depicts providing a sacrificial trace structure 10 using an additive forming method. The term 'sacrificial" denotes a structure that facilitates the formation of a material layer within a final device structure, yet the sacrificial structure is not present in the final device structure. The sacrificial trace structure 10 provides a structure having a geometry, e.g., including lines having angles or curvatures, that provides the geometry of the metal lines 2, 3 for the later formed coaxial wire structures, e.g., the structures identified by reference numbers 12a, 12b, 12c, 12d, 12e in FIGS. 1A-1C.

Additive Manufacturing (AM) is an appropriate name to describe the technologies that build 3D objects by adding layer-upon-layer of material, whether the material is dielectric, plastic, metal, of semiconductor composition or combination thereof. The sacrificial trace structure 10 is formed using a three dimensional additive method selected from the group consisting of stereolithography, self-propagating waveguide formation, fused deposition modeling (FDM), selective laser sintering (SLS), continuous liquid interface production (CLIP), digital light processing (DLP), material jetting, and combinations thereof.

Stereolithography a technique or process for creating three-dimensional objects, in which a computer-controlled moving laser beam is used to build up the required structure, layer by layer, from a liquid polymer that hardens on contact with laser light. In some embodiments, a stereolithography technique provides a method to build a 3D microstructure in a layer-by-layer process, which can involve a platform (e.g., substrate) that is lowered into a photo-monomer bath in discrete steps. At each layer, a laser is used to scan over the area of the photo-monomer that is to be cured (i.e., polymerized) for that particular layer. Once the layer is cured, the platform is lowered by a specific amount (i.e., determined by the processing parameters and desired feature/surface resolution), and the process is repeated until the complete 3D structure is created.

Fused deposition modeling (FDM) is an additive manufacturing technology, which works on an "additive" principle by laying down material in layers; a plastic filament or metal wire is unwound from a coil and supplies material to produce a part. In some embodiments, FDM builds parts up layer-by-layer by heating and extruding thermoplastic filament.

Self-propagating waveguide formation typically includes the use of a polymer foam, or other cellular material. Self-propagating waveguide may for ordered open cellular polymer materials with micro-lattice structures and features. These materials can be formed by exposing a two-dimensional mask with a pattern of circular apertures that is covering a reservoir containing a photomonomer. More specifically, collimated UV light can be used to expose liquid polymer through a mask to form polymer waveguide. Within the photomonomer, self-propagating photopolymer waveguides originate at each aperture in the direction of the UV collimated beam and polymerize together at points of intersection. By simultaneously forming an interconnected array of these fibers in three-dimensions and removing the uncured monomer, three dimensional lattice-based open-cellular polymer materials can be fabricated, In one embodiment, the sacrificial trace structure 10 is comprised of a polymeric material. When the sacrificial trace structure 10 is formed using stereolithography, the sacrificial trace structure 10 can be composed of a photo-hardenable resin compositions comprises of at least one photo-polymerizable compound, such as a photo-polymerizable modified urethane (meth)acrylate compound, an oligoester acrylate compound, an epoxyacrylate compound, an epoxy compound, a polyimide compound, an aminoalkyd compound, and a vinyl ether compound, as a main component, and a photosensitive polymerization initiator. When the sacrificial trace structure 10 is formed using FDM, the sacrificial trace structure 10 can be composed of Acrylonitrile Butadiene Styrene ABS, Polylactic acid PLA, Polycarbonate PC, Polyamide PA, Polystyrene PS, Polyether ether ketone PEEK, lignin, rubber, and combinations thereof. When the sacrificial trace structure 10 is formed using self-propagating waveguide formation, the sacrificial trace structure 10 may be composed of thiol-ene polymer.

It is noted that the above compositions for the sacrificial trace structure 10 and additive manufacturing processes are provided for illustrative purposes and are not intended to limit the disclosed methods and structures to only the above examples. For example, in addition to the above examples, the sacrificial trace structure 10 may also be formed using wire or textile layup, modular assembly, deformed perforated sheet lattice assembly, as well as other three dimensional additive methods.

Although the sacrificial trace structure 10 is depicted as having linear metal line portions, the sacrificial trace structure may include non-linear metal line portions, e.g., angled portions and curved portions, to provide coaxial wire structures similar to the non-linear metal lines 2, 3 of the coaxial wire structures 12a, 12b, 12c, 12d, 12e as depicted in FIGS. 1A and 1B.

Figure 3:
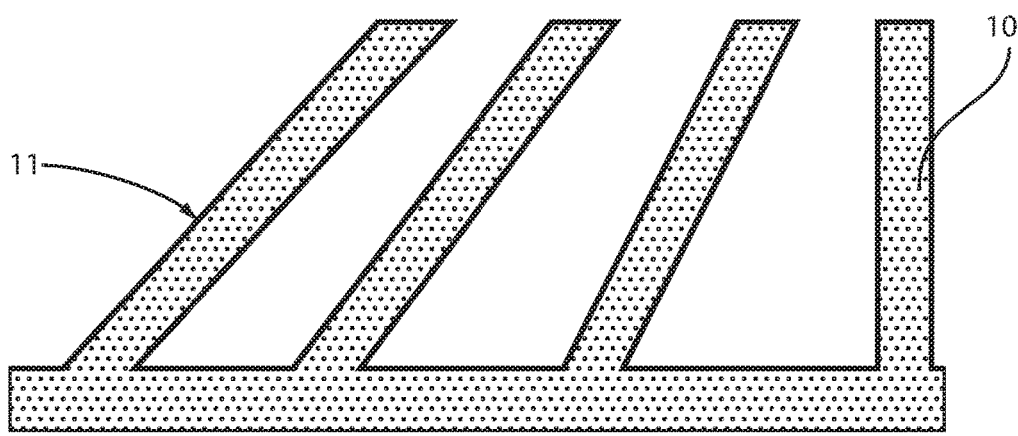
FIG. 3 is a side cross-sectional view depicting forming a continuous seed metal layer on the sacrificial trace structure, in accordance with one embodiment of the present disclosure.

FIG. 3 depicts one embodiment of forming a continuous seed metal layer 11 on the sacrificial trace structure 10. The continuous seed metal layer 11 may be composed of any metal, such as nickel, copper, aluminum, tungsten, titanium, platinum, tin, gold, silver, and combinations thereof. The thickness of the continuous seed metal layer 11 is selected to provide a seed layer for subsequent metal depositions, and have a thickness that is suitable to not be removed during the process step for removing the sacrificial trace structure 10. The continuous seed metal layer 11 is a deposited metal layer having a conformal thickness. The term "conformal" denotes a layer having a thickness that does not deviate from greater than or less than 30% of an average value for the thickness of the layer. By continuous it is meant that the continuous seed metal layer 11 is free of breaks.

The continuous seed metal layer 11 may be deposited using a physical vapor deposition (PVD) process, such as sputtering and vaporative deposition. In another example, the continuous seed metal layer 11 may be composed of nickel deposited using electroless plating. Electroless nickel plating (EN) is an auto-catalytic chemical technique used to deposit a layer of nickel-phosphorus or nickel-boron alloy. The process may employ a reducing agent, e.g., hydrated sodium hypophosphite ($NaPO_2H_2.H_2O$) which reacts with the metal ions to deposit metal. In other embodiments, the continuous seed metal layer 11 may be formed using electroplating and/or sputtering. In other embodiments, the continuous seed metal layer 11 may be formed using atomic layer deposition (ALD) or chemical vapor deposition (CVD), e.g., plasma enhanced chemical vapor deposition (PECVD). The thickness of the continuous seed metal layer 11 may have a thickness ranging from 5 nm to 100 µm. In another embodiment, the thickness of the continuous seed metal layer 11 may range from 1 µm to 100 µm. In another embodiment, the thickness of the continuous seed metal layer 11 may range from 10 nm to 50 nm. In some embodiments, the base material 9 may facilitate uniformity in the deposition of the continuous seed metal layer 11 on the portions of the sacrificial trace structure 10 that subsequently provide the metal lines of the coaxial wire structure of the interposer.

It is noted that in some embodiments a block mask may be formed atop a portion of the sacrificial trace structure 10 prior to forming the continuous seed metal layer 11 to select which portions of the sacrificial trace structure 10 may be coated with the continuous seed metal layer 11.

Figure 4:
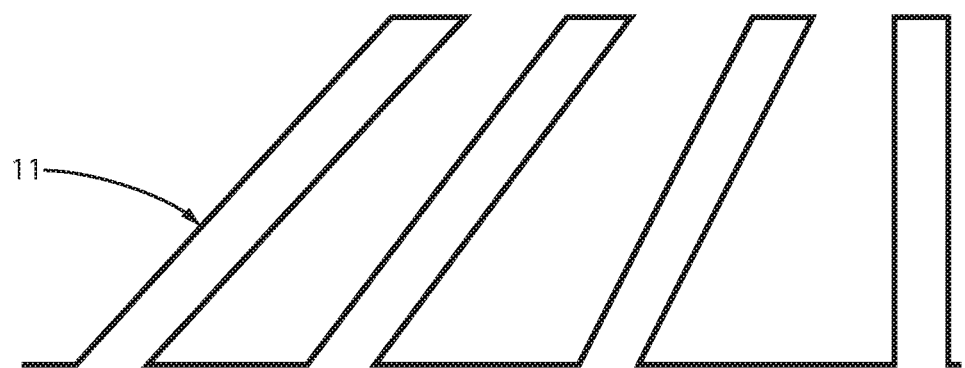
FIG. 4 is a side cross-sectional view depicting one embodiment of removing the sacrificial trace structure, wherein the continuous seed metal layer remains, in accordance with one embodiment of the present disclosure.

FIG. 4 depicts one embodiment of removing the sacrificial trace structure 10, wherein the continuous seed metal layer 11 remains. In some embodiments, the sacrificial trace structure 10 may be composed of a polymeric material that may be removed by dissolving the polymeric material. In some embodiments, the sacrificial trace structure 10 may be removed by an etch process that is selective to the continuous seed metal layer 11. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. The selective etch process may be a wet chemical etch or a dry etch.

Figure 5:
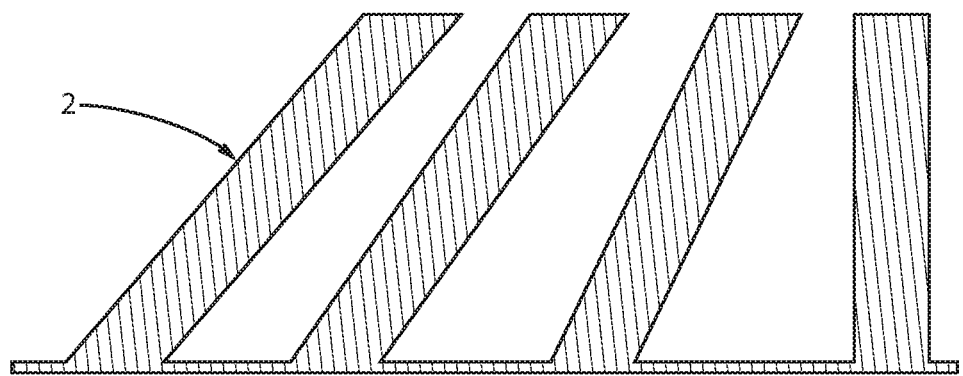
FIG. 5 is a side cross-sectional view depicting one embodiment of forming an first metal wiring layer on the continuous seed layer.

FIG. 5 illustrates one embodiment of forming a first metal wire layer 2 on the continuous seed metal layer 11. In one embodiment, the first metal wire layer 2 may be deposited directly on the continuous seed metal layer 11 at a thickness that provides coaxial wire structures including hollow portions. In another embodiment, the first metal wire layer 2 is deposited directly on the continuous metal seed layer 11 at a thickness to provide solid metal lines for the coaxial wires structure of the interposer, as depicted in FIG. 5.

The first metal wire layer 2 may be composed of any metal that provides an electrically conductive material. For example, the first metal wire layer 2 may be composed of copper, nickel, aluminum, titanium, tungsten, tantalum, platinum, tin, gold, silver and combinations thereof.

In some embodiments, first metal wire layer 2 may be deposited using a physical vapor deposition (PVD) method, such as sputtering, evaporative deposition, and combinations thereof. In some embodiments, the first metal wire layer 2 may be deposited using a plating method, such as electrolytic plating, electroless plating, and combinations thereof. In one embodiment, the first metal wire layer 2 is formed composed of copper deposited using electroplating. One example of a plating bath composition that is suitable for electroplating the first metal wire layer 2 of copper may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. In some other embodiments, the metal for the first metal wire layer 2 of the coaxial wire structure may be deposited using a chemical vapor deposition (CVD) process, such as plasma enhanced chemical vapor deposition (PECVD) and metal organic chemical vapor deposition (MOCVD). In yet other embodiments, the metal for the first metal wire layer 2 of the coaxial wire structure may be deposited using atomic layer deposition (ALD).

Figure 6:
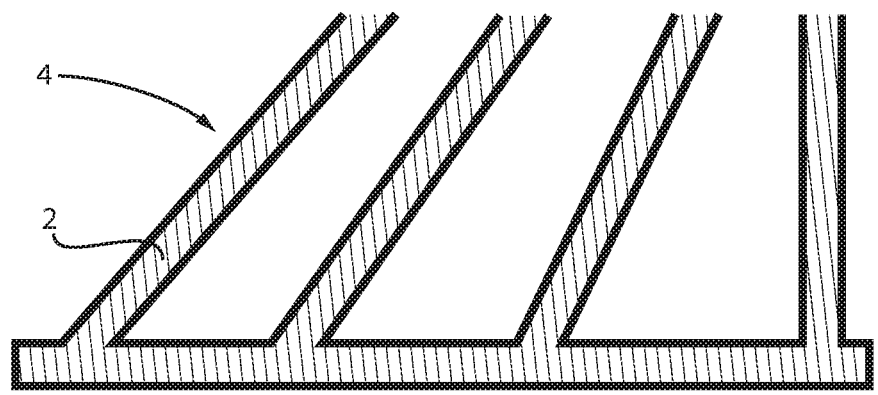
FIG. 6 is a side cross-sectional view depicting one embodiment of forming an electrically insulating layer on the first metal wiring layer.

FIG. 6 depicting one embodiment of forming an electrically insulating layer 4 on the first metal wiring layer 2. The electrically insulating layer 4 separates the first metal wire 2 of the coaxial wire structure from the subsequently formed second metal wire 3 of the coaxial wire structure. The electrically insulating layer 4 may be composed of any dielectric material. For example, the electrically insulating layer 4 may be dielectric material, such as an oxide, e.g., silicon oxide ($SiO_2$), nitride (silicon nitride) or oxynitride. In other embodiments, the electrically insulating layer 4 may be composed of a polymeric material. In some examples, the electrically insulating layer 4 is selected from the group consisting of parylene, organosiloxanes, epoxies, acrylates, urethanes, silicone, polyimide, poly(phrenylene oxide), polyamide, polyester, PEEK, polyethelyene naphthalate, polyetherimide, fluoropolymers, and combinations thereof.

The electrically insulating layer 4 is formed to electrically isolate the first metal wiring layer 2 from the subsequently formed second wiring layer 3, so that the first and second wiring layers 2, 3 can be arranged in the geometry of a coaxial wire. For example, the first metal wiring layer 2 may be the core of the coaxial wire, e.g., solid core with substantially circular cross section, and the electrically insulating layer 4 may be deposited as a cladding layer on the core of the first metal wiring layer 2. The electrically insulating layer 4 may cover an entirety of the sidewalls of the first metal wiring layer 2 to ensure electrical isolation of the first metal wiring layer 2 from the subsequently formed second metal wiring layer. The electrically insulating layer may be annular in cross-sectional geometry.

The electrically insulating layer 4 is typically formed using a conformal deposition process. For example, the electrically insulating layer 4 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the electrically insulating layer 4 is deposited using thermal growth, deposition from solution, dip coating, spray coating, and other physical vapor deposition processes.

Figure 7:
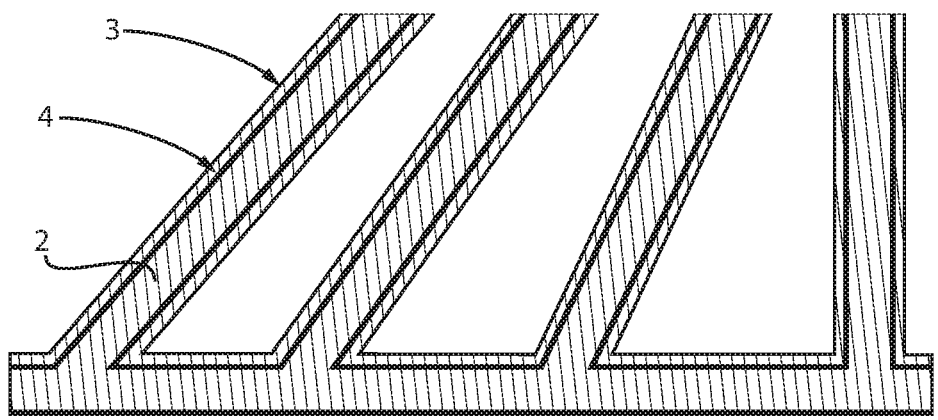
FIG. 7 is a side cross-sectional view depicting one embodiment of forming a second metal wiring layer on the electrically insulating layer.

FIG. 7 depicts one embodiment of forming a second metal wiring layer 3 on the electrically insulative layer 4. The second metal wire layer 3 may be composed of any metal that provides an electrically conductive material. For example, the second metal wire layer 3 may be composed of copper, nickel, aluminum, titanium, tungsten, tantalum, platinum, tin, gold, silver and combinations thereof. The second metal wiring layer 3 may be deposited directly on the electrically insulating layer 4. The second metal wiring layer 3 may be a conformally deposited material. The second metal wiring layer 3 may be annular in cross-sectional geometry. In some embodiments, second metal wiring layer 3 may be deposited using a physical vapor deposition (PVD) method, such as sputtering, evaporative deposition, and combinations thereof. In some embodiments, the second metal wire layer 3 may be deposited using a plating method, such as electrolytic plating, electroless plating, and combinations thereof. In some other embodiments, the metal for the second metal wire layer 3 of the coaxial wire structure may be deposited using a chemical vapor deposition (CVD) process, such as plasma enhanced chemical vapor deposition (PECVD) and metal organic chemical vapor deposition (MOCVD). In yet other embodiments, the metal for the second metal wire layer 3 of the coaxial wire structure may be deposited using atomic layer deposition (ALD).

The assembly of the second metal wiring layer 3, the electrically insulating material layer 4 and the first metal wiring layer 2 can provide a coaxial wire 12'. Although the coaxial wire 12' depicted in FIG. 7 does not include non-linear portions, the coaxial wire 12' depicted in the method described with reference to FIGS. 2-9 can have any of the geometries for the coaxial wires 12a, 12b, 12c, 12d, 12e that are illustrated in FIGS. 1A-1C that include angled portions and portions including curvatures.

Figure 8:
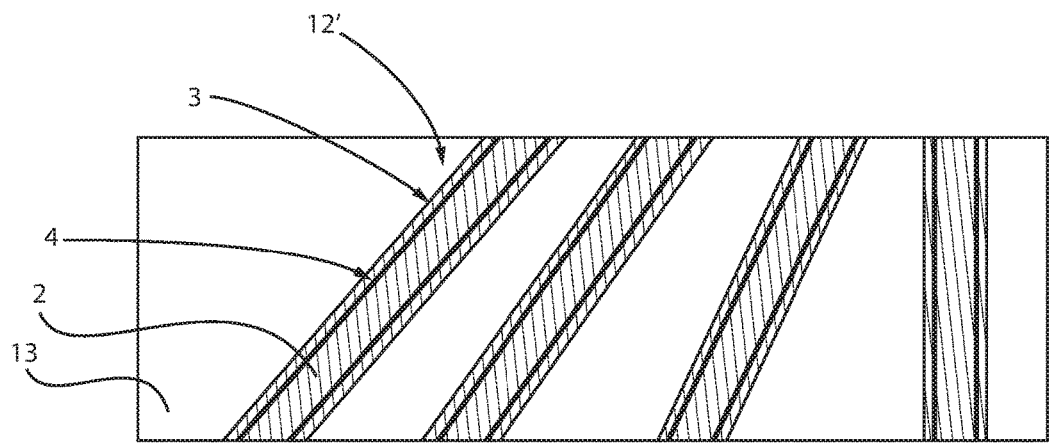
FIG. 8 is a side cross-sectional view depicting a dielectric material may then be formed on the assembly of the second metal wiring layer, the electrically insulating layer and the first metal wiring layer to encapsulate a majority of the coaxial metal wire, in accordance with one embodiment of the present disclosure.

FIG. 8 depicts one embodiment of a dielectric material 13 may then be formed on the coaxial wiring 12' to encapsulate a majority of the coaxial wire 12'. The dielectric material 13 for encapsulating the coaxial wire 12' can be composed of any dielectric or polymeric material that can be deposited in a manner that fills the voids between the adjacent coaxial wires 12' and provides the dielectric body 13 of the interposer. In some embodiments, the dielectric material 13 may be an oxide, nitride or oxynitride material. In some examples, the dielectric material 13 may be selected from the group consisting of $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyimides, polyphenylene oxide, or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The dielectric material 13 may be deposited using spin on deposition, chemical vapor deposition (CVD), deposition from solution, injection molding, transfer molding, and a vacuum may be employed to draw the dielectric material 13 within narrow passageways to ensure that the dielectric material 13 fully encapsulates the coaxial wires 12'.

FIG. 8 also depicts planarizing the opposing sidewalls of the dielectric material 13 to expose the ends of the coaxial wires 12'. Planarizing exposes the ends of the coaxial wire 12' so that the metal lines 2, 3 extend through the dielectric body 13 and provide points for being engaged in electrical communication to the structures that are engaged to the interposer. The planarization process may be provided by grinding, chemical mechanical planarization (CMP), polishing or a combination thereof.

Figure 9:
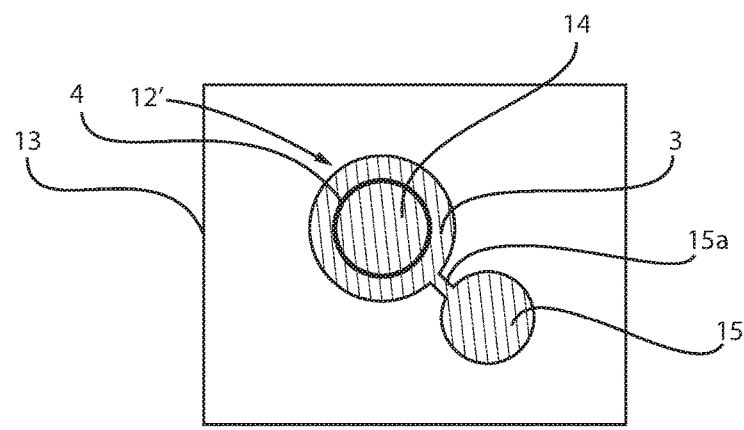
FIG. 9 is top down planar view depicting forming pads for solder bump processing of the structure depicted in FIG. 8.

FIG. 9 depicts solder bump processing of the structure depicted in FIG. 8. More specifically, FIG. 9 illustrates the pads for connecting solder bumps to the metal wires 2, 3 of the coaxial wire 12'. Solder bumps (also referred to as "solder balls"), such as C4 (controlled collapse chip connection) bumps, have been used to bond a chip to a chip carrier or to a chip to an interposer and then bond the interposer to the chip carrier. The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps may be small spheres of solder (solder balls) that are bonded to contact areas, interconnect lines or pads of semiconductor devices. In some embodiments, the solder bumps can be made from lead-free solder mixtures or lead tin solder. The solder bumps 14, 16 may be deposited using injection molding soldering (IMS) or sputtering.

Referring to FIG. 9, a first pad (identified by reference number 14) to the first metal line 2 may be present directly under the first metal line 2 to be contacted by a first solder bump. A second pad (identified by reference number 15) for connectivity to the second metal wire 3 through an addition solder bump may be laterally separated from the second metal wire 3 to facilitate solder bump formation in a manner that would not short to the solder bump to the first metal line 2. The second pad 15 may be connected to the second metal wire 3 through a laterally connecting portions 15*a*.

Figure 1D:
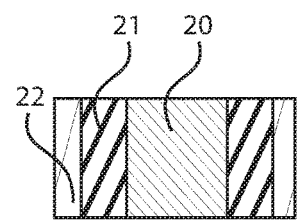
FIG. 1D is a magnified side cross-sectional view of a portion of an optical fiber that may be incorporated into the structures depicted in FIGS. 1A and 1B.

In another aspect of the present disclosure, a structure is provided for transmitting optical signals that includes optical fibers, which is formed using additive manufacturing methods. By using additive manufacturing methods, optical fibers may be formed extending through dielectric materials having curvatures and angled portions that were could previously not be formed using subtractive methods such as patterning and etching. The structure for transmitting optical signals is similar to the coaxial wiring structure depicted in FIGS. 1A-1C, which the exception that the core of the structure is an optical fiber, as opposed to a metal wire 2. Therefore the description of the metal lines of the coaxial wire having reference numbers 12*a*, 12*b*, 12*c*, 12*d* and 12*e* is equally applicable to the embodiments in which the coaxial wire is substituted with a structure having an optical fiber. For the embodiments of the disclosure including an optical fiber, each of the structures having reference numbers 12*a*, 12*b*, 12*c*, 12*d* and 12*e* have a cross section as depicted in FIG. 1D. For example, the core of each of the structures includes an optical fiber 20 having a first and second metal cladding layer 21, 22 positioned thereof, as depicted in FIG. 1D.

Referring to FIGS. 1A, 1B and 1D, the structure including the optical fiber 20 may include a dielectric base material 13; and a polymeric optical fiber 20 extending through the dielectric base material 13 from a first side of the dielectric base material 13 to an opposing second side of the dielectric base material 13. The at least one polymeric optical fiber 20 has at least one non-linear portion. For example, all of the geometries listed for the metal lines having reference numbers 12*a*, 12*b*, 12*c*, 12*d* and 12*e* are equally applicable for the assembly of the optical fiber 20, first and second metal cladding layers 21, 22 and the dielectric base material 13. For example, the non-linear portion of the polymeric optical fiber 20 may be a single arc extending continuously from a first side to a second side of the dielectric base material 13, similar to the geometry depicted for structure identified by reference number 12*d*. In another example, the non-linear portion of the polymeric optical fiber 20 may include at least one non-linear portion that includes multiple arcs, similar to the geometry depicted for the structures identified by reference numbers 12*b*, 12*c*, and 12*e*. In yet another embodiment, the polymeric optical fiber 20 may include angled portions, similar to the geometry depicted for the structures identified by reference number 12*a*. Any of the angles for the metal wire having reference number 12*a* is applicable for an angle describing the non-linear portions of the angled optical fiber 20. It is also noted that an interposer may be provided including polymeric optical fibers 20 having at least one non-linear portion in combination with polymeric optical fibers 20 that are entirely linear.

The optical fiber carries an optical signal. The polymeric composition for the polymeric optical fiber 20 may be any polymeric composition typically employed in optical fibers, which can also be used to form three dimensional structures using additive manufacturing, as described herein. In some embodiments, the polymeric optical fiber 20 may be composed of at least one of poly(methyl methacrylate)(PMMA) and polystyrene, which can have refractive indices of 1.49 and 1.59, respectively. In some embodiments, the polymeric optical fiber 20 can also be composed of silicone resin, which can have a refractive index of approximately 1.46. In other embodiments, a combination of polymeric materials may be employed. For example, PMMA and/or polystyrene can be a core material, while silicone resin can be a cladding material for the optical fiber 20.

The dielectric base material 13 for the structure including the optical fiber 20 may be similar to the dielectric base material of the structures including the coaxial wire. Therefore, the description of the dielectric base material that is provided above with reference to FIGS. 1A-9 is suitable for describing the dielectric base material 13 that can be used in the structure including the polymeric optical fiber 20. For example, the dielectric base material 13 may be composed of $SiO_2$, $Si_3N_4$, $SiO_xN_y$, SiC, SiCO, SiCOH, SiCH compounds, carbon doped oxides, inorganic oxides, inorganic polymers, hybrid polymers, organic polymers, polyimides, polyphenylene oxide, organo-inorganic materials, spin-on glasses, silsesquioxane-based materials, diamond-like carbon (DLC), amorphous hydrogenated carbon and combinations thereof.

The polymeric optical fiber 20 and the dielectric base material 13 may be separated from each other by at least one metal cladding layer 21, 22. Each of the metal cladding layers may be composed of a metal selected from the group consisting of nickel, aluminum, copper, tantalum, titanium, platinum and combinations thereof. In addition to providing the cladding layer for the polymeric optical fiber, the at least one cladding layer 21, 22 can carry an electrical signal, e.g., carry an electrical signal similar to the function of a metal wire, across the body of the dielectric base material 13. In some embodiments, the optical fiber carries an optical signal, and the cladding layer carries an electrical signal.

Figure 10:
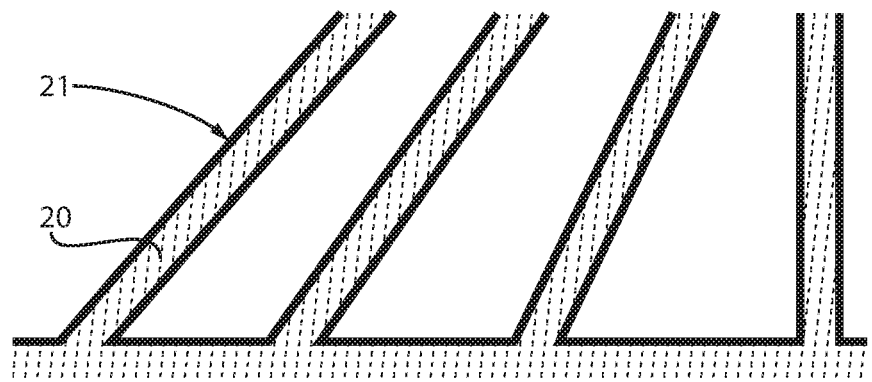
FIG. 10 is a side cross-sectional view depicting a method of forming an optical fiber using an additive forming method, and forming a first cladding layer on the optical fiber, in accordance with one embodiment of the present disclosure.

FIG. 10 depicts a method of forming an optical fiber 20 using an additive forming method, and forming a first cladding layer 21 on the optical fiber. The optical fiber 20 may be formed using any of the aforementioned additive forming methods that are described for forming the sacrificial trace structure 10 that is described above with reference to FIG. 2. In the embodiment depicted in FIG. 10, the optical fiber 20 is being formed from a polymeric material, which is the material in which the selected geometry for the optical fiber 20 is being formed using additive manufacturing. For example, the additive manufacturing method may be selected from stereolithography, self-propagating waveguide formation, fused deposition modeling (FDM), selective laser sintering (SLS), continuous liquid interface production (CLIP), digital light processing (DLP), material jetting, wire or textile layup, modular assembly, deformed perforated sheet lattice assembly, as well as other three dimensional additive methods.

The first cladding layer 21 may be composed of any metal that can be deposited. The deposition methods may be physical vapor deposition (PVD) process, such as sputtering, evaporative deposition, and combinations thereof. In some embodiments, the first cladding layer 21 may be deposited using a plating method, such as electrolytic plating, electroless plating, and combinations thereof. The deposition process for forming the first cladding layer may also be provided by chemical vapor deposition processes, and/or atomic layer deposition (ALD).

Figure 11:
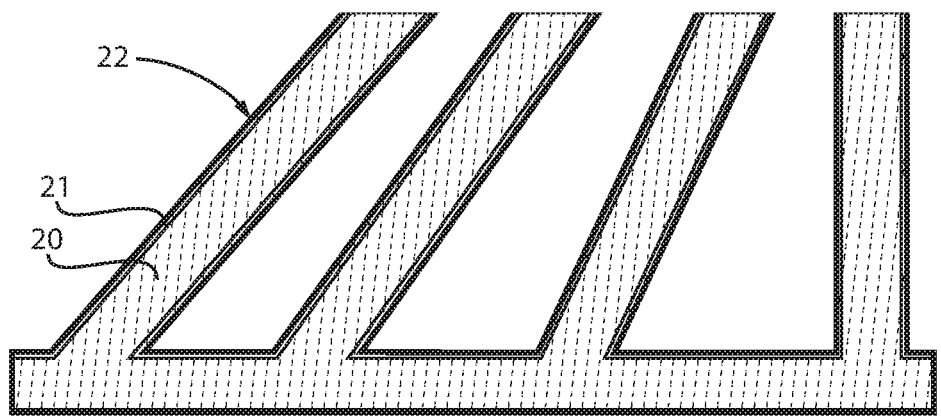
FIG. 11 is a side cross-sectional view depicting forming a second cladding layer on the optical fiber depicted in FIG. 10, in accordance with one embodiment of the present disclosure.

FIG. 11 depicts forming a second cladding layer 22 on the optical fiber 20 depicted in FIG. 10. More specifically, the second cladding layer 22 is formed directly on the first cladding layer 21, in which the first cladding layer 21 is formed directly on the optical fiber 20. The second cladding layer 22 may be composed of any metal that can be deposited. The deposition methods for forming the second cladding layer 22 may be physical vapor deposition (PVD) process, such as sputtering, evaporative deposition, and combinations thereof. In some embodiments, the second cladding layer 22 may be deposited using a plating method, such as electrolytic plating, electroless plating, and combinations thereof. The deposition process for forming the second cladding layer 22 may also be provided by chemical vapor deposition processes, and/or atomic layer deposition (ALD).

Figure 12:
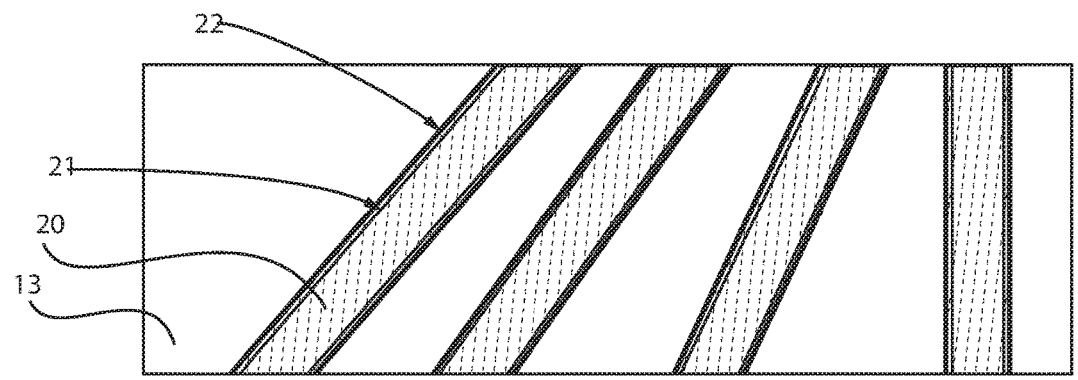
FIG. 12 is a side cross-sectional view depicting forming a supporting material around the optical fiber and cladding layers, in accordance with one embodiment of the present disclosure.

FIG. 12 is a side cross-sectional view depicting forming a supporting material around the optical fiber 20 and the cladding layers 21, 22. The supporting material can provide the dielectric base material 13, which can be formed using spin on deposition, deposition from solution, chemical vapor deposition (CVD), as well as other known deposition processes.

Figure 13:
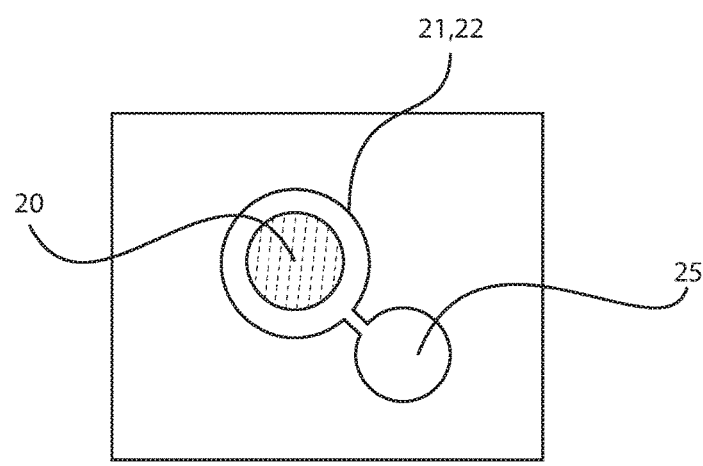
FIG. 13 is a top down planar view of the forming pads for communication to the fiber optic and cladding layers depicted in FIG. 12.

FIG. 13 is a top down planar view of the forming pads 25 for communication to cladding layers 21, 22 surrounding the fiber optic 20.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A coaxial wire structure comprising:
a rigid dielectric base material; and
a metal based interconnect structure extending through said rigid dielectric base material from a first side of the dielectric base material to an opposing second side of the rigid dielectric base material, wherein at least one metal line of the metal based interconnect structure that extends from the first side of the rigid dielectric base material to the second side of said rigid dielectric base material has at least one non-linear portion, the metal based interconnect structure being an assembly of a first metal interconnect layer and a second metal interconnect layer separated from each other by an electrically insulating layer.

2. The coaxial wire structure of claim 1, wherein said at least one non-linear portion is a single arc extending continuously from a first side to a second side of the dielectric base material.

3. The coaxial wire structure of claim 1, wherein said at least one non-linear portion comprises multiple arcs.

4. The coaxial wire structure of claim 1, wherein said at least one non-linear portion comprises two linear portions intersecting at an angle.

5. The coaxial wire structure of claim 1, wherein said electrically insulating layer comprises a dielectric comprised of an oxide, nitride or oxynitride material, or said electrically insulating layer comprises a polymer selected from the group consisting of parylene, organosiloxanes, epoxies, acrylates, urethanes, silicones, polyimide, poly(phenylene oxide), polyamide, polyester, PEEK, polyethelyene naphthalate, polyetherimide, fluoropolymers, and combinations thereof.

6. The coaxial wire structure of claim 1, wherein the first metal interconnect layer is comprised of a metal selected from the group consisting of nickel, aluminum, copper, tantalum, titanium, platinum and combinations thereof.

7. The coaxial wire structure of claim 1, wherein the second metal interconnect layer is comprised of a metal selected from the group consisting of nickel, aluminum, copper, tantalum, titanium, platinum and combinations thereof.

8. A structure including an optical fiber comprising:
a rigid dielectric base material; and
a polymeric optical fiber extending through said rigid dielectric base material from a first side of the rigid dielectric base material to an opposing second side of the rigid dielectric base material, wherein at least one polymeric optical fiber has at least one non-linear portion, the polymeric optical fiber and the rigid dielectric base material separated from each other by at least one metal cladding layer.

9. The structure of claim 8, wherein said at least one non-linear portion comprises at least one curvature.

10. The structure of claim 8, wherein said at least one non-linear portion comprises at least one angled portion.

11. The structure of claim 10, wherein the optical fiber carries an optical signal, and the cladding layer carries an electrical signal.

12. The structure of claim 10, wherein said polymer for said optical fiber comprises optical fiber comprises PMMA, polystyrene, silicone resin and combinations thereof.

13. The structure of claim 8, wherein the at least one metal cladding layer is comprised of a metal selected from the group consisting of nickel, aluminum, copper, tantalum, titanium, platinum and combinations thereof.

14. The structure of claim 8, wherein the polymeric optical fiber is formed using an additive forming method that is selected from the group consisting of stereolithography, self-propagating waveguide formation, fused deposition modeling (FDM), selective laser sintering (SLS), continuous liquid interface production (CLIP), digital light processing (DLP), material jetting and combinations thereof.

15. A coaxial wire structure comprising:
a rigid dielectric base material; and
a metal based interconnect structure extending through said rigid dielectric base material from a first side of the rigid dielectric base material to an opposing second side of the dielectric base material, wherein at least one metal line of the metal based interconnect structure that extends from the first side of the rigid dielectric base material to the second side of said dielectric base material has at least one non-linear portion that is a single arc extending continuously from a first side to a second side of the rigid dielectric base material, the metal based interconnect structure being an assembly of a first metal interconnect layer and a second metal interconnect layer separated from each other by an electrically insulating layer.

16. The coaxial wire structure of claim 15, wherein said electrically insulating coating comprises a dielectric comprised of an oxide, nitride or oxynitride material, or said electrically insulating coating comprises a polymer selected from the group consisting of parylene, organosiloxanes, epoxies, acrylates, urethanes, silicones, polyimide, poly (phenylene oxide), polyamide, polyester, PEEK, polyethelyene naphthalate, polyetherimide, fluoropolymers, and combinations thereof.

17. The coaxial wire structure of claim 15, wherein the first metal interconnect layer is comprised of a metal selected from the group consisting of nickel, aluminum, copper, tantalum, titanium, platinum and combinations thereof.

18. The coaxial wire structure of claim 15, wherein the second metal interconnect layer is comprised of a metal selected from the group consisting of nickel, aluminum, copper, tantalum, titanium, platinum and combinations thereof.

19. The coaxial wire structure of claim 15, wherein the metal based interconnect structure carries an electrical signal.

* * * * *